United States Patent
Yamashita et al.

(10) Patent No.: US 9,809,017 B2
(45) Date of Patent: Nov. 7, 2017

(54) MEMBER BONDING APPARATUS AND METHOD

(71) Applicant: ORIGIN ELECTRIC COMPANY, LIMITED, Saitama (JP)

(72) Inventors: Takuto Yamashita, Saitama (JP); Tomoyuki Saito, Saitama (JP); Masahiro Sudo, Saitama (JP)

(73) Assignee: ORIGIN ELECTRIC COMPANY, LIMITED, Saitama (JP)

(*) Notice: Subject to any disclaimer, the term of this patent is extended or adjusted under 35 U.S.C. 154(b) by 0 days.

(21) Appl. No.: 15/026,575

(22) PCT Filed: Aug. 4, 2015

(86) PCT No.: PCT/JP2015/072151
§ 371 (c)(1),
(2) Date: Mar. 31, 2016

(87) PCT Pub. No.: WO2016/042935
PCT Pub. Date: Mar. 24, 2016

(65) Prior Publication Data
US 2016/0214364 A1    Jul. 28, 2016

(30) Foreign Application Priority Data

Sep. 16, 2014    (JP) ................. 2014-187598

(51) Int. Cl.
*B32B 41/00*    (2006.01)
*B32B 37/12*    (2006.01)
(Continued)

(52) U.S. Cl.
CPC .............. *B32B 37/12* (2013.01); *B32B 37/10* (2013.01); *C09J 5/00* (2013.01); *G02F 1/1303* (2013.01);
(Continued)

(58) Field of Classification Search
CPC ..... B32B 37/12; B32B 37/10; B32B 2305/72; C09J 5/00
(Continued)

(56) References Cited

U.S. PATENT DOCUMENTS 7,364,633 B2*  4/2008  Lim ...................... G02F 1/1339
                                                   156/275.5
2012/0247644 A1* 10/2012 Usui ................... B32B 37/1284
                                                   156/64
2013/0064967 A1*  3/2013 Feinstein ................. B05C 9/12
                                                   427/8

FOREIGN PATENT DOCUMENTS

JP    2010-024321    2/2010
JP     5486704       5/2014
(Continued)

OTHER PUBLICATIONS

International Search Report for Application No. PCT/JP2015/072151, dated Oct. 27, 2015.

*Primary Examiner* — Michael N Orlando
*Assistant Examiner* — Joshel Rivera
(74) *Attorney, Agent, or Firm* — Squire Patton Boggs (US) LLP

(57) ABSTRACT

To allow short time spreading for adhesive, verifying whether the adhesive is spread out to a member end. In obtaining a bonded member by applying the adhesive to a surface of one of two members and bonding the members with a member bonding device, a tilt adjusting device acquires with a camera an image of spreading state of the adhesive in the members' bonding surface, and adjusts the tilt of the bonded member when a non-spreading part of the adhesive between ends of the bonded member and the adhesive has a size bias so that the adhesive moves to the larger side of the part, and a spreading adjustment device controls a pushing amount and a pushing time interval of a (Continued)

pressing-side member to adjust spreading of the adhesive so that the part size reduces to a predetermined size depending on the part size acquired with the camera, and cures the adhesive in the bonded member edge with the non-spreading part eliminated.

9 Claims, 8 Drawing Sheets

(51) Int. Cl.
    *C09J 5/00*     (2006.01)
    *B32B 37/10*     (2006.01)
    *G02F 1/13*     (2006.01)
    *G02F 1/1333*     (2006.01)

(52) U.S. Cl.
    CPC .... *G02F 1/133308* (2013.01); *B32B 2305/72* (2013.01); *B32B 2457/202* (2013.01); *G02F 2001/133331* (2013.01); *G02F 2202/28* (2013.01); *H01L 2224/753* (2013.01); *H01L 2224/756* (2013.01); *H01L 2224/75745* (2013.01); *H01L 2224/75802* (2013.01); *H01L 2224/75803* (2013.01); *H01L 2224/75804* (2013.01); *H01L 2224/75901* (2013.01); *H01L 2224/83862* (2013.01); *H01L 2224/83874* (2013.01); *H01L 2224/83908* (2013.01)

(58) Field of Classification Search
    USPC .......................... 156/64, 350, 368, 378, 379
    See application file for complete search history.

(56) References Cited

FOREIGN PATENT DOCUMENTS

| | | |
|---|---|---|
| JP | 5486705 | 5/2014 |
| JP | 2014-141679 | 8/2014 |
| WO | WO 2011/136069 | 11/2011 |

\* cited by examiner

MEMBER BONDING APPARATUS AND METHOD

TECHNICAL FIELD

The present invention relates to a member bonding apparatus and method in which two members are bonded by means of adhesive to make a bonded member as well as a manufacturing method of the bonded member.

BACKGROUND ART

As an apparatus for bonding two members that are a liquid crystal panel and a cover glass, for example, by means of adhesive to make a bonded member, there has been known a pressing type apparatus for applying an adhesive between two members and pressing two members to spread the adhesive. For example, there has been known an apparatus for applying the adhesive to part of a bonding surface of one member, mating the bonding surfaces of two members to bring the adhesive into contact with the other member, and pressing the two members to spread the adhesive (for example, see Patent Document 1).

In addition, there has been known an apparatus that determines tilt of one of the two members, includes an α-axis drive part for driving in an X-axis rotational direction (rotational direction on the YZ-plane), a β-axis drive part for driving in a Y-axis rotational direction (rotational direction on the ZX-plane), and a κ-axis drive part for driving in a Z-axis rotational direction (rotational direction on the XY-plane), adjusts the member in the α-, β-, or θ-axis direction to correct the tilt or torsion of the member, and thus adjusts the tilt of the two members so that the members are kept level (see Patent Document 2).

Furthermore, there has been known an apparatus that cures only the adhesive in the edge of the bonded member in advance, and can prevent the adhesive in the bonded member from squeezing out of the edge of the bonded member, even in a state where the overall adhesive between two members which are bonded is not yet cured (see Patent Document 3).

PRIOR ART DOCUMENT

Patent Document

[Patent Document 1] Japanese Patent Application Publication No. 2010-024321
[Patent Document 2] Japanese Patent No. 5486704
[Patent Document 3] Japanese Patent No. 5486705

DISCLOSURE OF INVENTION

Problem to be Solved by the Invention

However, the manufacturing of the bonded member with the pressing type takes a long time because of the influence of spreading time of the adhesive depending on the size of the member to be bonded or the physical properties of the adhesive. Particularly, the larger the friction of an interface between the member and the adhesive is, the larger the viscosity of the adhesive is, or the poorer the wettability of the adhesive is, the slower the spreading speed of the adhesive becomes. Furthermore, when the members are not in parallel with each other or application quantity of the adhesive is not uniform, it may take a long time that the adhesive spreads out to the end of the member.

Consequently, as disclosed in the Patent Document 2, the tilt or torsion of the member is rectified, and the tilt of the two members is adjusted so that the members are kept level, or, as disclosed in the Patent Document 3, only the adhesive in the edge of the bonded member is cured in advance, and the adhesive in the bonded member can be prevented from squeezing out of the edge of the bonded member. However, either of the conventional techniques does not verify whether the adhesive spreads out to the end of the member or not, and therefore, there may be the case where the adhesive does not spread out to entire surface of the member in proper quantities. Furthermore, it may take a long time that the adhesive is let spread out to entire surface of the member neither too much nor too little.

The object of the present invention is to provide the member bonding apparatus and method that enables the adhesive to be spread out in a short time while it is verified whether the adhesive is spread out to an end of a member or not.

Means for Solving the Problem

A member bonding apparatus according to aspect 1 of the present invention, comprises: an adhesive application device for applying an adhesive to a bonding surface (a surface to be bonded) of one of two members to be bonded; a member bonding device for pressing either one of the two members with the adhesive between the two members, the adhesive being applied by the adhesive application device, pushing a pressing-side member onto an opposite-side member, bonding the bonding surfaces of the two members, and making a bonded member; a tilt adjusting device for acquiring with a camera an image of a spreading state of the adhesive in the bonding surface of the two members of the bonded member that is bonded by the member bonding device, and adjusting the tilt of the bonded member when a non-spreading part of the adhesive between an end of the bonded member and an end of the adhesive has a bias in size so that the adhesive moves to the larger side of the non-spreading part; a spreading adjustment device for controlling a pushing amount and a pushing time interval of a pressing-side member to adjust the spreading of the adhesive so that the size of the non-spreading part reduces to a predetermined size depending on the size of the non-spreading part acquired with the camera; and an adhesive curing processing device for curing the adhesive in an edge of the bonded member when the non-spreading part is eliminated through the adjustment by the spreading adjustment device.

The member bonding apparatus according to aspect 2 is the apparatus according to aspect 1, wherein the spreading adjustment device is configured to increase the pushing amount when the size of the non-spreading part is larger, decrease the pushing amount when the size of the non-spreading part is smaller, and extend the pushing time interval as the size of the non-spreading part decreases.

The member bonding apparatus according to aspect 3 is the apparatus according to aspect 1 or 2, wherein the size of the non-spreading part is a length or an area of the non-spreading part.

A method of bonding or manufacturing a bonded member according to aspect 4, comprises the steps of: applying an adhesive to a bonding surface of one of two members to be bonded; pressing either one of the two members with the adhesive between the two members, pushing a pressing-side member onto an opposite-side member, and bonding the bonding surfaces of the two members; acquiring an image of a state of spreading of the adhesive in the bonding surfaces of the two members of the bonded member that is bonded with the adhesive, and adjusting the tilt of the bonded member when a non-spreading part of the adhesive between an end of the bonded member and an end of the adhesive has a bias in size so that the adhesive moves to the larger side of the non-spreading part; controlling a pushing amount and a pushing time interval of a pressing-side member to adjust the spreading of the adhesive so that the size of the non-spreading part reduces to a predetermined size depending on the size of the non-spreading part; and curing the adhesive in an edge of the bonded member when the non-spreading part is eliminated.

The method of bonding or manufacturing a bonded member according to aspect 5 is the method according to aspect 4, wherein the pushing amount is increased when the size of the non-spreading part is larger, the pushing amount is decreased when the size of the non-spreading part is smaller, and the pushing time interval is extended as the size of the non-spreading part decreases.

The method of bonding or manufacturing a bonded member according to aspect 6 is the method according to aspect 4 or 5, wherein the size of the non-spreading part is a length or an area of the non-spreading part.

A method of bonding or manufacturing a bonded member according to aspect 7 comprises the steps of: providing two members to be bonded to the member bonding apparatus according to any one of aspects 1 through 3; and bonding the two members with the member bonding apparatus.

Effect of the Invention

According to the invention in the first and fourth aspects, since the image of the spreading state of the adhesive in the bonding surface of the two members of the bonded member that is bonded is acquired with the camera, it can easily be verified whether the adhesive is spread out to the end of the bonded member or not. The tilt of the bonded member or tilt of one of the two members is adjusted so that the adhesive moves to the larger side of the non-spreading part when a non-spreading part of the adhesive in the image between an end of the bonded member and an end of the adhesive has a bias in size. And a pushing amount and a pushing time interval of a pressing-side member is controlled to adjust the spreading of the adhesive so that the size of the non-spreading part reduces to a predetermined size depending on the size of the non-spreading part. Therefore, the adhesive can be spread out in a short time. Furthermore, since the adhesive in an edge of the bonded member is cured when the non-spreading part is eliminated, the bonded member without squeezing-out of the adhesive and shortage in the adhesive can be obtained.

According to the invention in the second and fifth aspects, in addition to the effects of the invention in the first and fourth aspects, since the pushing amount is increased when the size of the non-spreading part is larger, the pushing amount is decreased when the size of the non-spreading part is smaller, and the pushing time interval is extended as the size of the non-spreading part decreases, the spreading adjustment of the adhesive can be accurately performed.

According to the invention in the third and sixth aspects, in addition to the effects of the invention in the first and fourth aspects or the second and fifth aspects, since the size of the non-spreading part is a length or an area of the non-spreading part, the non-spreading part can be verified easily.

BEST MODE FOR CARRYING OUT THE INVENTION

This application is based on the Patent Application No.2014-187598 filed on Sep. 16, 2014 in Japan, the contents of which are hereby incorporated in its entirety by reference into the present application, as part thereof.

The present invention will become more fully understood from the detailed description given hereinbelow. The other applicable fields will become apparent with reference to the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

Figure 1:
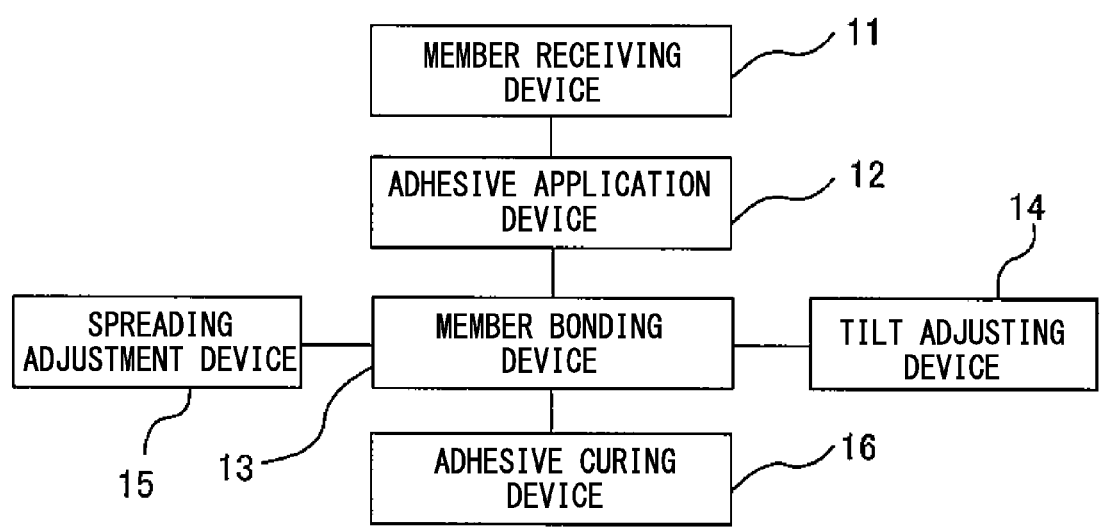
FIG. 1 is a block diagram, showing one example of the member bonding apparatus according to an embodiment of the present invention.

An embodiment of the present invention will be described hereinafter. FIG. 1 is a block diagram that shows an example of a member bonding apparatus according to an embodiment of the present invention. A member receiving device 11 includes a jig for receiving two members to be bonded, and the member is mounted to align with the position of the jig. An adhesive application device 12 is configured to apply the adhesive to the bonding surface of one of the two members received by the member receiving device 11, and an amount of the adhesive whose thickness becomes constant is applied. A member bonding device 13 makes the bonded member by pressing either one of the two members via the adhesive applied by the adhesive application device 12, pushing a pressing-side member onto the opposite-side member, and bonding the bonding surfaces of the two members.

A tilt adjusting device 14 acquires from a camera an image of a spreading state of the adhesive in the bonding surface of the two members of the bonded member that is bonded by the member bonding device 13, determines whether non-spreading a part of the adhesive has a bias in size between an end of the bonded member and an end of the adhesive or not, and adjusts the tilt of (one of the two members of) the bonded member when the non-spreading part of the adhesive has a bias in size so that the adhesive moves to the larger side of the non-spreading part.

A spreading adjustment device 15 controls a pushing amount and a pushing time interval of a pressing-side member to adjust the spreading of the adhesive so that the size of the non-spreading part reduces to a predetermined size depending on the size of the non-spreading part in the image of the spreading state of the adhesive acquired with the camera. An adhesive curing processing device 16 cures the adhesive in the edge of the bonded member when the non-spreading part is eliminated through the adjustment by the spreading adjustment device 15.

Figure 2:
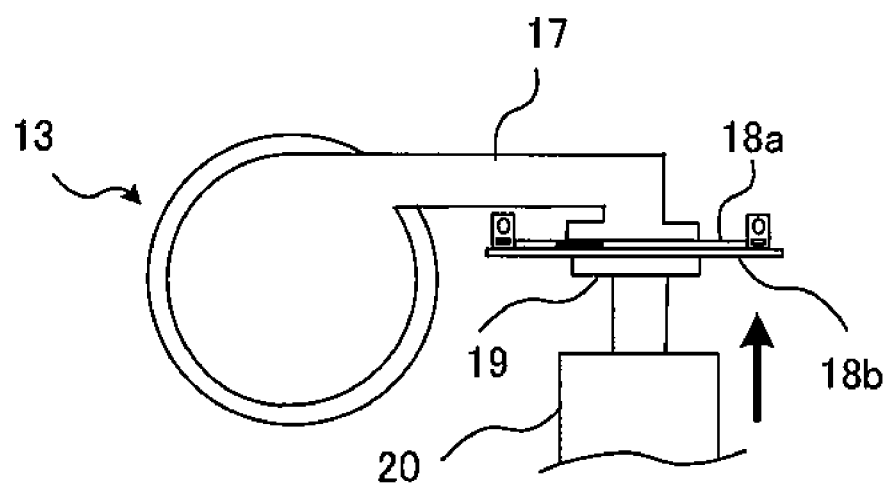
FIG. 2 is a diagram, illustrating one example of bonding of two members by a member bonding device according to the embodiment of the present invention.

FIG. 2 is a diagram, illustrating one example of bonding of two members by the member bonding device 13. In FIG. 2, the member bonding device 13 suctions and holds one member 18*a* with a holding device 17, brings it above the other member 18*b* mounted on a member mount table 19, lifts up the member mount table 19 with a drive unit 20, presses the other member 18*b* to push the other member 18*b* onto the one member 18*a*, and bonds the bonding surfaces of the two members 18*a*, 18*b* through the adhesive. Alternatively, the present embodiment may utilize the pressing force of the holding device 17 that holds the one member 18*a* to push the one member 18*a* onto the other member 18*b*.

Figure 3:
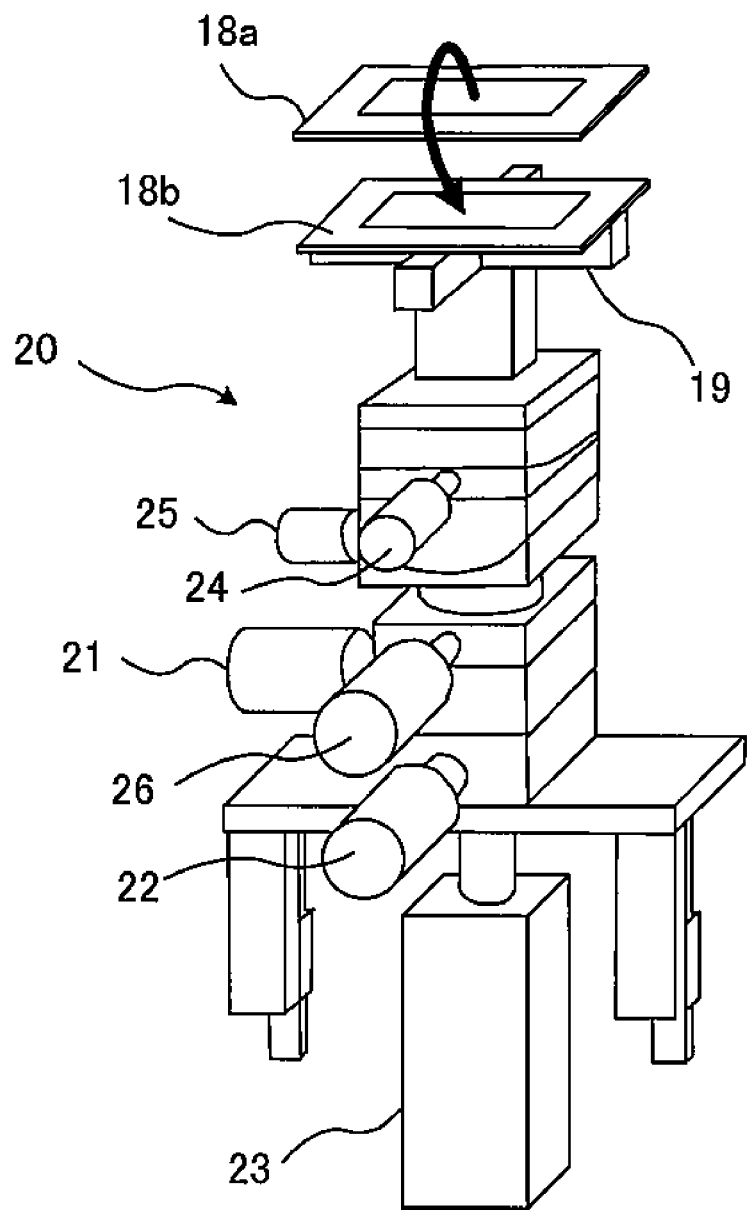
FIG. 3 is a perspective view, showing an example of a tilt adjusting device and a spreading adjustment device according to the embodiment of the present invention.

FIG. 3 is a perspective view, showing examples of the tilt adjusting device 14 and the spreading adjustment device 15. In FIG. 3, the member bonding device 13 (holding device 17) and the camera are not shown.

The one member 18*a* is held by the holding device of the member bonding device which is not shown in the drawing, rotated a half-turn by the holding device, and moved so as to be positioned above the other member 18*b* mounted on the member mount table 19. Then, the member mount table 19 is driven by the drive unit 20.

The drive unit 20 includes an X-axis drive part 21 for driving the member mount table 19 in an X-axis direction, a Y-axis drive part 22 for driving the member mount table 19 in a Y-axis direction, a Z-axis drive part 23 for driving the member mount table 19 in a Z-axis direction, an α-axis drive part 24 for driving the member mount table 19 in an X-axis rotational direction (a rotational direction on a YZ-plane), a β-axis drive part 25 for driving the member mount table 19 in a Y-axis rotational direction (a rotational direction on a ZX-plane), and a θ-axis drive part 26 for driving the member mount table 19 in a Z-axis rotational direction (a rotational direction on an XY-plane).

Figure 4:
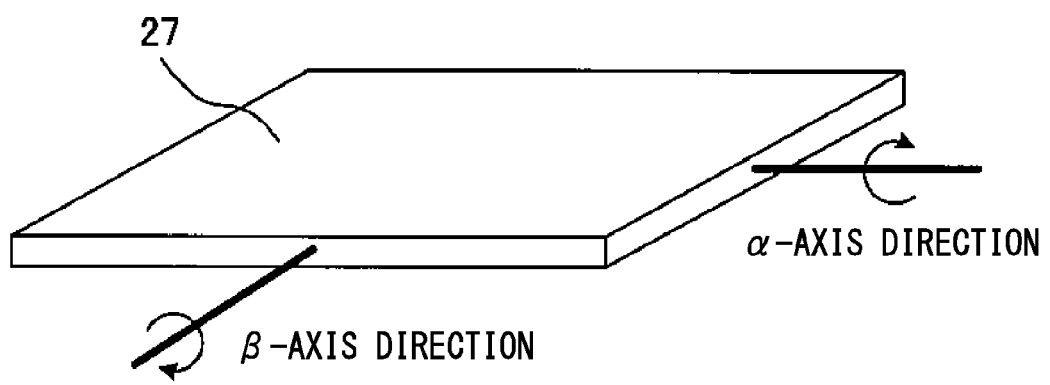
FIG. 4 is a diagram, illustrating one example of the tilt adjustment of the member by the tilt adjusting device according to an embodiment of the present invention.

FIG. 4 is a diagram, illustrating one example of the tilt adjustment of the member by the tilt adjusting device 14. The tilt adjusting device 14 adjusts the positions of the member mount table 19 bearing a bonded member 27 in which the one member 18*a* and the other member 18*b* are bonded together. In order to adjust the tilt of the bonded member 27 mounted on the member mount table 19, the α-axis drive part 24 and the β-axis drive part 25 in the drive unit 20 of the member bonding device 13 are used to adjust the tilt of the bonded member 27 so that the adhesive moves to the larger side of the non-spreading part.

Figure 5:
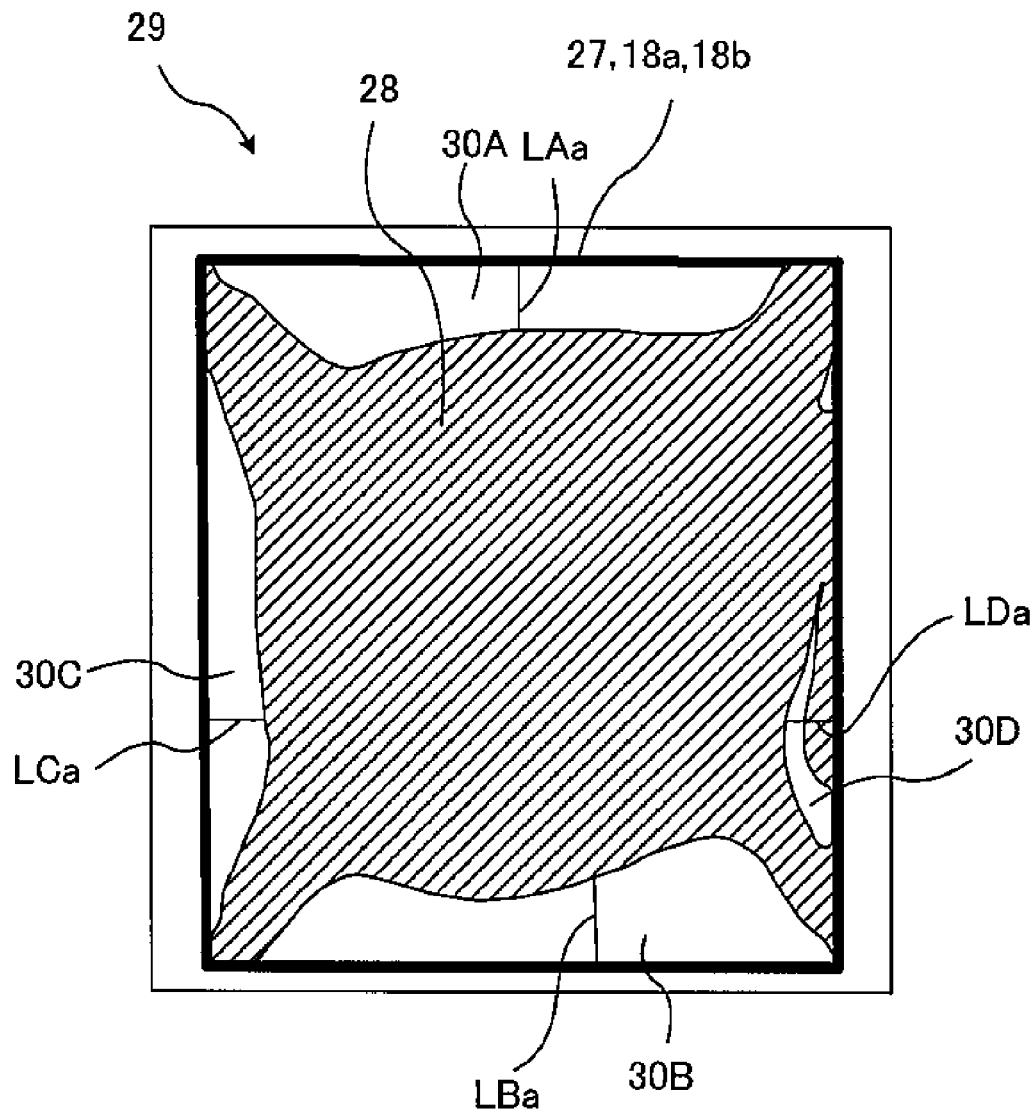
FIG. 5 is a plan view of one example of an adhesive spreading state image, showing a spreading state of the adhesive in a bonding surface of the two members of the bonded member that is bonded by the member bonding device according to the embodiment of the present invention.

FIG. 5 is a plan view of one example of an adhesive spreading state image 29, showing the spreading state of an adhesive 28 in the bonding surface of the two members 18*a*, 18*b* of the bonded member 27 that is bonded by the member bonding device 13. This adhesive spreading state image 29 is acquired with the camera and input into the spreading adjustment device 15. The spreading adjustment device 15 always monitors the size of a non-spreading part 30 of the adhesive 28 between the end of the bonded member 27 and the end of the adhesive 28 when the adhesive spreading state image 29 is input, as shown in FIG. 5.

The size of the non-spreading part 30 is considered as a length La of the non-spreading part 30 or an area of the non-spreading part 30. FIG. 5 shows a case that the size of the non-spreading part 30 is considered as the length La. The following description describes the case that the size of the non-spreading part 30 is considered as the length La of the non-spreading part 30. For the length La of the non-spreading part 30, the non-spreading part 30 is divided into some regions (for example, i), a length Lai of the non-spreading part 30 in the divided parting line is measured, and the average value of the length Lai or the maximum value of the length Lai is utilized.

Various cases are shown in which the length La of the non-spreading part 30 in a non-spreading part 30A on the upper side of FIG. 5 is considered as LAa, the length La of the non-spreading part 30 in a non-spreading part 30B on the lower side of FIG. 5 is considered as LBa, the length La of the non-spreading part 30 in a non-spreading part 30C on the left side of FIG. 5 is considered as LCa, and the length La of the non-spreading part 30 in a non-spreading part 30D on the right side of FIG. 5 is considered as LDa.

The spreading adjustment device 15 always calculates the size (length La) of the non-spreading part 30 of the bonded member 27. The spreading adjustment device 15 also calculates a pushing amount W and a pushing time interval T of the pressing-side member in accordance with the size (the length La) of the non-spreading part 30, whereby the non-spreading part 30 is reduced to equal to or smaller than the predetermined size, presses the pressing-side member with the calculated pushing amount W and pushing time interval T through the member bonding device 13, and adjusts the spreading state of the adhesive 28 in the bonding surface of the bonded member 27. An example of the pushing amount W and the pushing time interval T adjusted by the spreading adjustment device 15 is shown in Table 1.

TABLE 1

|  | First Region | Second Region | Third Region | Fourth Region | Fifth Region |
| --- | --- | --- | --- | --- | --- |
| Average Length La | La ≥ L1 | L1 > La ≥ L2 | L2 > La ≥ L3 | L3 > La ≥ L4 | L4 > La ≥ 0 |
| Pushing Amount W | W1 | W2 | W3 | W4 | Stop/UV |
| Time Interval T | T1 | T2 | T3 | T4 | — |

As shown in Table 1, the spreading adjustment device 15 increases the pushing amount W when the size (length La) of the non-spreading part 30 is larger, decreases the pushing amount W when the size of the non-spreading part 30 is smaller, and extends the pushing time interval T as the size of the non-spreading part 30 decreases.

When the length La of the non-spreading part 30 of the bonded member 27 is equal to or greater than a first set value L1 (within the first region), the pushing amount W of the other member 18*b* is set to a first predetermined value W1 and the pushing time interval T is set to a first predetermined time interval T1. When the length La of the non-spreading part 30 is less than the first set value L1 and equal to or greater than a second set value L2 (within the second region), the pushing amount W of the other member 18b is set to a second predetermined value W2 (W2≤W1) and the pushing time interval T is set to a second predetermined time interval T2 (T2≥T1). Similarly, when the length La of the non-spreading part 30 is less than the second set value L2 and equal to or greater than a third set value L3 (within the third region), the pushing amount W of the other member 18b is set to a third predetermined value W3 (W3≤W2) and the pushing time interval T is set to a third predetermined time interval T3 (T3≥T2). Furthermore, when the length La of the non-spreading part 30 is less than the third set value L3 and equal to or greater than a fourth set value L4 (within the fourth region), the pushing amount W of the other member 18b is set to a fourth predetermined value W4 (W4≤W3) and the pushing time interval T is set to a fourth predetermined time interval T4 (T4≥T3). When the length La of the non-spreading part 30 becomes less than the fourth set value L4 (within the fifth region), the spreading adjustment device 15 stops the pushing of the other member 18b and waits until the length La of the non-spreading part 30 becomes zero.

As described above, the pushing amount W and the pushing time interval T are controlled. When the length La of the non-spreading part 30 is large (in a state where the spreading is insufficient), the pushing amount W is increased, the distance between the two members 18a, 18b is decreased, the pushing time interval T is shortened, and thus the spreading of the adhesive is accelerated. As the adhesive spreads out to some extent, the pushing amount W is gradually decreased, and the pushing time interval T is extended, so that the adhesive 28 can be prevented from squeezing out of the bonded member 27.

In other words, when the length La of the non-spreading part 30 is large, the pushing amount W is increased and the pushing time interval T is shortened in order to spread the adhesive in a short time. As the length La of the non-spreading part 30 decreases, the pushing amount W is decreased and the pushing time interval T is extended, so that the adhesive 28 can be prevented from squeezing out.

Figure 6:
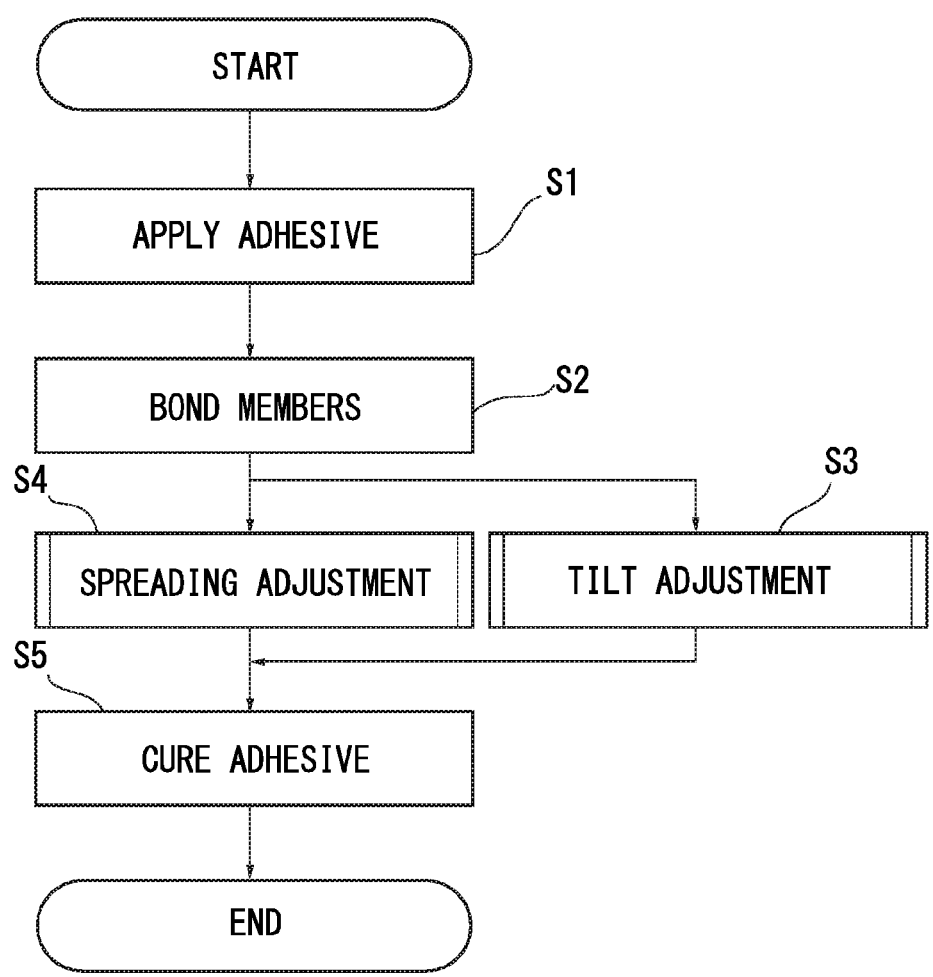
FIG. 6 is a flowchart, showing an example of a member bonding method according to an embodiment of the present invention.

FIG. 6 is a flowchart, showing an example of a member bonding method or a bonded member manufacturing method according to an embodiment of the present invention. First, the adhesive is applied to the bonding surface of one of the two members to be bonded (S1). The application of the adhesive to one of the two members is performed with the adhesive application device. Either of the two members is pressed via the adhesive applied by the adhesive application device, the pressing-side member is pushed onto the opposite-side member, and the bonding surfaces of the two members are bonded (S2). The bonding of the two members is performed with the member bonding device.

Next, the tilt adjustment of the bonded member that is bonded with the adhesive is performed (S3), and the spreading adjustment of the adhesive is also performed (S4). The tilt adjustment of the bonded member is performed with the tilt adjusting device. The tilt adjustment of the bonded member is performed, as described below, by acquiring the image of the spreading state of the adhesive in the bonding surface of the two members of the bonded member that is bonded with the adhesive, and adjusting the tilt of the bonded member when the non-spreading part of the adhesive has a bias in size between the end of the bonded member and the end of the adhesive so that the adhesive moves to the larger side of the non-spreading part.

Meanwhile, the spreading adjustment of the adhesive performed with the spreading adjustment device 15. The spreading adjustment of the adhesive is performed, as described below, by controlling the pushing amount and the pushing time interval of the pressing-side member so that the size of the non-spreading part reduces to the predetermined size depending on the size of the non-spreading part. Then, the adhesive in the edge of the bonded member is cured when the non-spreading part is eliminated through the spreading adjustment of the adhesive (S5). The curing of the adhesive is performed with an adhesive curing processing device. The curing of the adhesive is performed by irradiation of ultraviolet or application of heat, for example.

Figure 7:
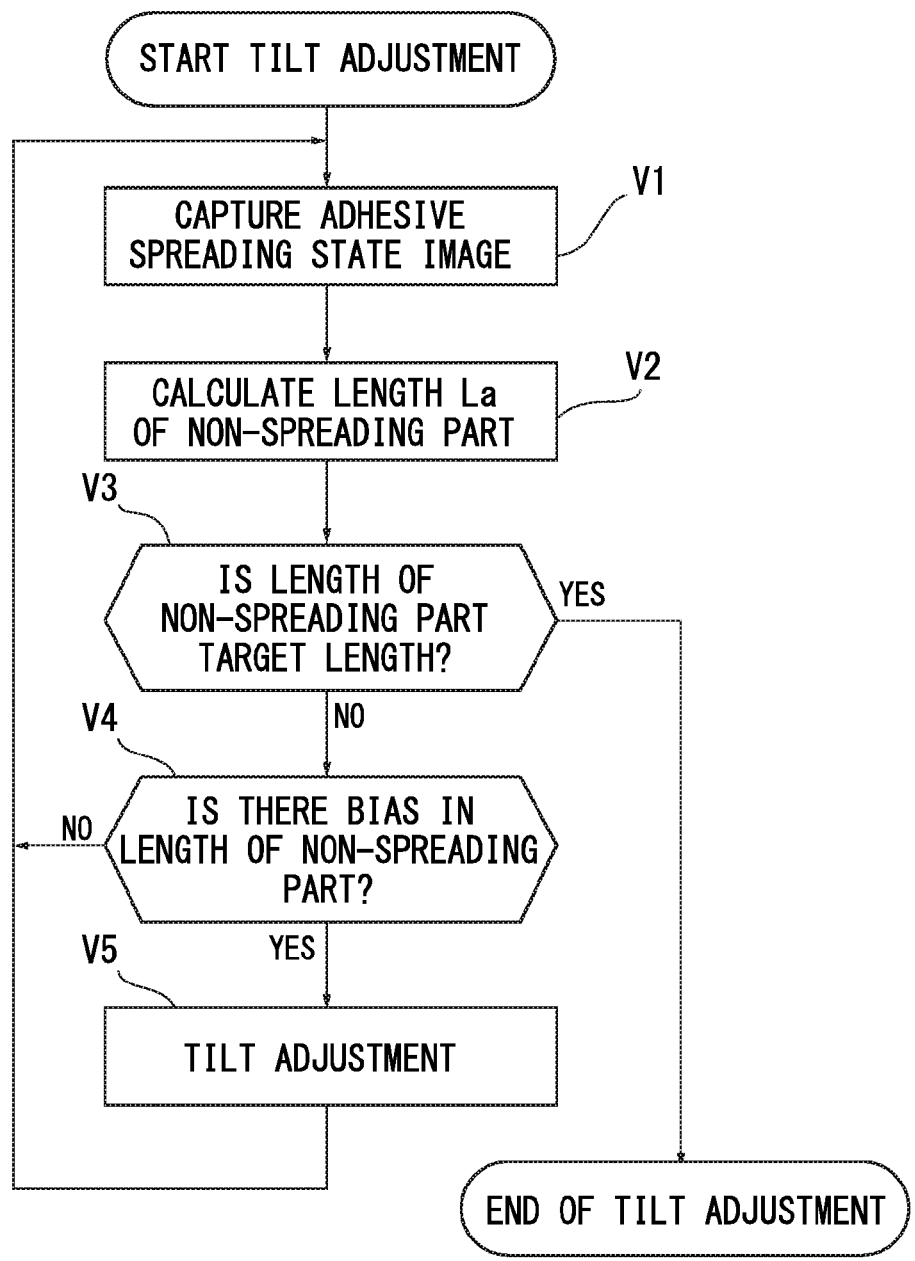
FIG. 7 is a flowchart, showing one example of processing details of the tilt adjustment in step S3 of FIG. 6.

FIG. 7 is a flowchart, showing one example of processing details of the tilt adjustment in step S3 of FIG. 6. First, the adhesive spreading state image 29 acquired with the camera is captured (V1), and as shown in FIG. 5, the length La of the non-spreading part 30 between the end of the bonded member 27 and the end of the adhesive 28 is calculated (V2), based on the adhesive spreading state image 29. Then, it is determined whether the length La of the non-spreading part is a target length or not (V3), and when the length La of the non-spreading part satisfies the target length, the tilt adjustment processing is terminated. The target length is usually zero. Incidentally, the target length may not be zero in a state where a small amount of the non-spreading part 30 is left in accordance with the viscosity of the adhesive. Thus, in order to respond to the above situation, the target length can be the length satisfying the fifth region of the Table 1 (L4>La≥0), for example.

On the one hand, when the length La of the non-spreading part does not reach the target length, it is determined that whether the non-spreading part has a bias in length or not (V4), the process returns to step V1 when there is no bias in the length La of the non-spreading part. On the other hand, when there is a bias in the length La of the non-spreading part, the tilt adjustment is performed so that the adhesive moves to the larger side of the non-spreading part 30, and then the process returns to step V1 (V5).

Figure 8:
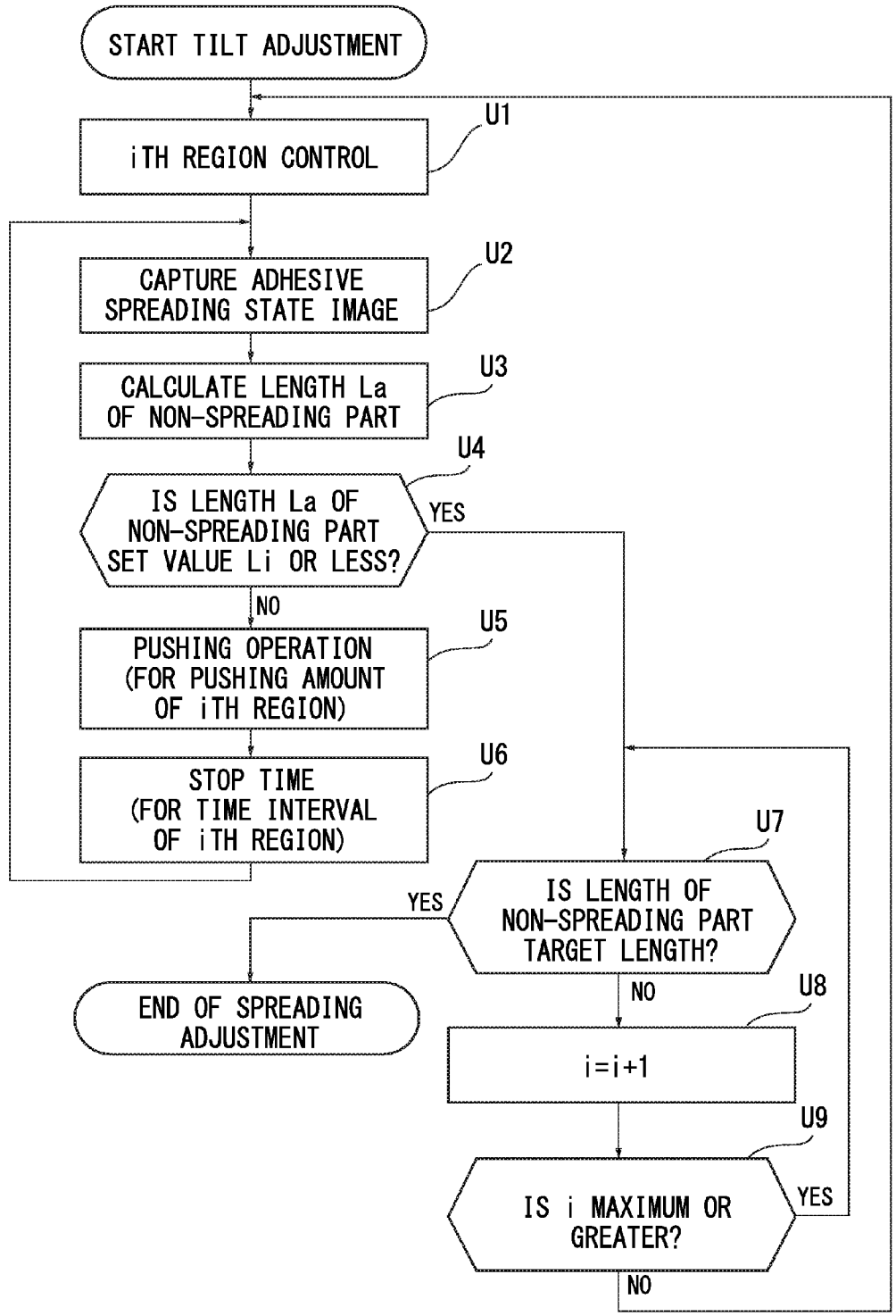
FIG. 8 is a flowchart, showing one example of processing details of the spreading adjustment in step S4 of FIG. 6.

FIG. 8 is a flowchart, showing one example of processing details of the spreading adjustment in step S4 of FIG. 6. First, a variable i is set to 1 as an i-th region control (U1). Then, the adhesive spreading state image 29 acquired with the camera is captured (U2), and the length La of the non-spreading part 30 between the end of the bonded member 27 and the end of the adhesive 28 is calculated, based on the adhesive spreading state image 29 (U3).

It is determined whether the length La of the non-spreading part 30 is equal to or less than a set value Li or not (U4). At the time of the start, since the variable i is set to 1 in step U1, it is determined whether the length La of the non-spreading part 30 is equal to or less than the first set value L1 or not. When the determination in step U4 is made that the length La of the non-spreading part 30 is greater than the first set value L1, the first region shown in the Table 1 is employed, the pushing operation for the pushing amount W1 in the first region is performed (U5), a stop time for the time interval T1 in the first region is secured, and then the process returns to step U2 (U6).

The pushing operation in step U5 and the securing of the stop time in step U6 enables the accelerating state of the spreading of the adhesive. In that state, again, the adhesive spreading state image 29 is captured (U2), the length La of the non-spreading part 30 is calculated (U3), and whether the length La of the non-spreading part 30 is equal to or less than the first set value L1 or not is determined (U4). In the determination in step U4, when the length La of the non-spreading part 30 is equal to or less than the first set value L1, it is determined whether the length La of the non-spreading part 30 reaches the target length (U7), and 1 is added to the variable i (U8) when the length La of the non-spreading part 30 does not reach the target length.

Then, it is determined whether the variable i is equal to or greater than the maximum value (i=5 in the case of Table 1) or not (U9), and when the variable i is greater than the maximum value, the process returns to step U7. When the variable i is not greater than the maximum value, the process returns to step U1, and a second region control (i=2) is started. Similarly, the processes from step U2 through step U9 are performed, and the spreading adjustment processes are terminated when the determination in step U7 is made that the adhesive spreads out to the target length. The target length is usually zero. Incidentally, the target length may not be zero in a state where a small amount of the non-spreading part 30 is left in accordance with the viscosity of the adhesive. For example, the target length can be the length satisfying the fifth region of the Table 1 (L4>La≥0).

The adhesive curing processing device 16 cures the adhesive in the edge of the bonded member 27 when the non-spreading part 30 of the adhesive 28 between the end of the bonded member 27 and the end of the adhesive 28 is eliminated. For example, the adhesive is cured by the irradiation of ultraviolet or the application of heat to the edge of the bonded member 27. The elimination of the non-spreading part 30 of the adhesive 28 is determined when the maximum length between the end of the bonded member 27 and the end of the adhesive 28 becomes zero, rather than under the condition that the size of the non-spreading part 30 becomes zero, in a case where an average length is used as the size of the non-spreading part 30.

Although the foregoing description has been described in the case that the size of the non-spreading part 30 is considered to be represented by the length La of the non-spreading part 30, it may be by an area where the adhesive does not spread out. In the case that the area is considered, the elimination of the non-spreading part 30 of the adhesive 28 is determined when the area of the non-spreading part 30 becomes zero. Furthermore, although the foregoing description has been described such that the two members 18a, 18b are of flat panel type, the two members may be of a block type, and it is applicable that the bonding surfaces are tilted and the adhesive flows slantingly.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising", "having", "including" and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS

11: member receiving device, 12: adhesive application device, 13: member bonding device, 14: tilt adjusting device, 15: spreading adjustment device, 16: adhesive curing processing device, 17: holding device, 18: member, 19: member mount table, 20: drive unit, 21: X-axis drive part, 22: Y-axis drive part, 23: Z-axis drive part, 24: α-axis drive part, 25: β-axis drive part, 26: θ-axis drive part, 27: bonded member, 28: adhesive, 29: adhesive spreading state image, 30: non-spreading part

The invention claimed is:

1. A member bonding apparatus, comprising:
   a member bonding device for pressing either one of two members to be bonded with an adhesive between the two members, the adhesive being applied to a bonding surface of one of the two members, pushing a pressing-side member onto an opposite-side member, bonding the bonding surfaces of the two members, and making a bonded member;
   a camera for acquiring an image of a spreading state of the adhesive in the bonding surface of the two members of the bonded member that is bonded by the member bonding device;
   a tilt adjusting device for adjusting, based on the image acquired by the camera, the tilt of the bonded member when a non-spreading part of the adhesive between an end of the bonded member and an end of the adhesive has a bias in size so that the adhesive moves to the larger side of the non-spreading part;
   a spreading adjustment device for controlling a pushing amount and a pushing time interval of a pressing-side member to adjust the spreading of the adhesive so that the size of the non-spreading part reduces to a predetermined size depending on the size of the non-spreading part acquired with the camera; and
   an adhesive curing processing device for curing the adhesive in an edge of the bonded member when the non-spreading part is eliminated through the adjustment by the spreading adjustment device.

2. The member bonding apparatus according to claim 1, wherein the spreading adjustment device is configured to increase the pushing amount when the size of the non-spreading part is larger, decrease the pushing amount when the size of the non-spreading part is smaller, and extend the pushing time interval as the size of the non-spreading part decreases.

3. The member bonding apparatus according to claim 1, wherein the size of the non-spreading part is a length or an area of the non-spreading part.

4. A method of manufacturing a bonded member, comprising the steps of:
applying an adhesive to a bonding surface of one of two members to be bonded;
pressing either one of the two members with the adhesive between the two members, pushing a pressing-side member onto an opposite-side member, and bonding the bonding surfaces of the two members;
acquiring an image by a camera of a state of spreading of the adhesive in the bonding surfaces of the two members of the bonded member that is bonded with the adhesive, and adjusting, based on the image acquired by the camera, the tilt of the bonded member when a non-spreading part of the adhesive between an end of the bonded member and an end of the adhesive has a bias in size so that the adhesive moves to the larger side of the non-spreading part;
controlling a pushing amount and a pushing time interval of a pressing-side member to adjust the spreading of the adhesive so that the size of the non-spreading part reduces to a predetermined size depending on the size of the non-spreading part acquired with the camera; and
curing the adhesive in an edge of the bonded member when the non-spreading part is eliminated.

5. The method of manufacturing a bonded member according to claim 4,
wherein the pushing amount is increased when the size of the non-spreading part is larger, the pushing amount is decreased when the size of the non-spreading part is smaller, and the pushing time interval is extended as the size of the non-spreading part decreases.

6. The method of manufacturing a bonded member according to claim 5, wherein the size of the non-spreading part is a length or an area of the non-spreading part.

7. The member bonding apparatus of claim 1, wherein the camera is configured to acquire the image of a divided region of the non-spreading part and the tilt adjusting device is configured to control the pushing amount and the pushing time interval based on a measured length of the non-spreading part in a divided parting line in the image of the divided region.

8. The method of manufacturing a bonded member of claim 4, wherein the non-spreading part is divided into regions and a length of the non-spreading part in a divided parting line is measured.

9. The method of manufacturing a bonded member of claim 8, wherein the pushing amount and the pushing time interval are controlled for each divided region.

* * * * *